United States Patent
Sun et al.

(10) Patent No.: US 11,927,844 B2
(45) Date of Patent: Mar. 12, 2024

(54) DISPLAY SUBSTRATE AND METHOD FOR MANUFACTURING SAME, AND DISPLAY DEVICE

(71) Applicants: Beijing BOE Optoelectronics Technology Co., Ltd., Beijing (CN); BOE Technology Group Co., Ltd., Beijing (CN)

(72) Inventors: Zepeng Sun, Beijing (CN); Yong Zhang, Beijing (CN); Xianglei Qin, Beijing (CN); Jian Wang, Beijing (CN); Yanchen Li, Beijing (CN); Jian Lin, Beijing (CN); Limin Zhang, Beijing (CN); Zhichao Yang, Beijing (CN); Liangzhen Tang, Beijing (CN); Zhilong Duan, Beijing (CN); Yashuai An, Beijing (CN); Lingfang Nie, Beijing (CN); Honggui Jin, Beijing (CN); Li Tian, Beijing (CN)

(73) Assignees: Beijing BOE Optoelectronics Technology Co., Ltd., Beijing (CN); BOE Technology Groups Co., Ltd., Beijing (CN)

( * ) Notice: Subject to any disclaimer, the term of this patent is extended or adjusted under 35 U.S.C. 154(b) by 0 days.

(21) Appl. No.: 17/764,448

(22) PCT Filed: Mar. 9, 2021

(86) PCT No.: PCT/CN2021/079709
§ 371 (c)(1),
(2) Date: Mar. 28, 2022

(87) PCT Pub. No.: WO2021/213036
PCT Pub. Date: Oct. 28, 2021

(65) Prior Publication Data
US 2023/0030213 A1 Feb. 2, 2023

(30) Foreign Application Priority Data
Apr. 23, 2020 (CN) .......................... 202010327231.9

(51) Int. Cl.
*G02F 1/1333* (2006.01)
*G02F 1/133* (2006.01)
(Continued)

(52) U.S. Cl.
CPC .... *G02F 1/133388* (2021.01); *G02F 1/13306* (2013.01); *G02F 1/133354* (2021.01);
(Continued)

(58) Field of Classification Search
CPC ......... G02F 1/133388; G02F 1/133354; G02F 1/13306; G02F 1/13452; G02F 1/136286;
(Continued)

(56) References Cited

U.S. PATENT DOCUMENTS

2003/0189542 A1  10/2003  Lee et al.
2013/0076716 A1  3/2013  Lim et al.
(Continued)

FOREIGN PATENT DOCUMENTS

CN  1549997 A  11/2004
CN  1760946 A  4/2006
(Continued)

OTHER PUBLICATIONS

Translation of CN-111210755-A (Year: 2020).*
CN202010327231.9 first office action.

*Primary Examiner* — Lixi C Simpson
(74) *Attorney, Agent, or Firm* — IPro, PLLC (57) ABSTRACT

Provided is a display substrate. The display substrate includes: a base substrate including a display region and a non-display region surrounding the display region; a gate drive circuit disposed in the non-display region; a plurality (Continued)

of first signal lines disposed in the peripheral region and connected to the gate drive circuit; and a plurality of second signal lines disposed in the non-display region and connected to the gate drive circuit; wherein each of the first signal line and the second signal line is configured to supply a signal to the gate drive circuit, and a frequency of the signal supplied by the first signal line is lower than a frequency of the signal supplied by the second signal line.

18 Claims, 4 Drawing Sheets

(51) Int. Cl.
| | |
|---|---|
| *G02F 1/1345* | (2006.01) |
| *G02F 1/1362* | (2006.01) |
| *G02F 1/1368* | (2006.01) |
| *G09G 3/36* | (2006.01) |
| *H01L 27/12* | (2006.01) |

(52) U.S. Cl.
CPC .... *G02F 1/13452* (2013.01); *G02F 1/136286* (2013.01); *G02F 1/1368* (2013.01); *G09G 3/3677* (2013.01); *H01L 27/124* (2013.01); *H01L 27/1259* (2013.01); *G09G 2300/0408* (2013.01); *G09G 2300/0426* (2013.01); *G09G 2310/08* (2013.01); *G09G 2320/043* (2013.01); *G09G 2330/02* (2013.01)

(58) Field of Classification Search
CPC ............... G02F 1/1368; G09G 3/3677; G09G 2300/0408; G09G 2300/0426; G09G 2310/08; G09G 2330/02; H01L 27/124; H01L 27/1259
See application file for complete search history.

(56) References Cited

U.S. PATENT DOCUMENTS

| | | | |
|---|---|---|---|
| 2014/0147976 A1* | 5/2014 | Shim | .......................... G03F 1/22 430/5 |
| 2016/0085106 A1* | 3/2016 | Lim | ....................... G02F 1/1339 345/206 |
| 2017/0076819 A1 | 3/2017 | Lin et al. | |
| 2017/0249916 A1 | 8/2017 | Jen et al. | |
| 2017/0287428 A1 | 10/2017 | Xue et al. | |
| 2019/0165079 A1 | 5/2019 | Cho et al. | |
| 2019/0325978 A1 | 10/2019 | Li et al. | |
| 2020/0142268 A1* | 5/2020 | Shin | ..................... G02F 1/13458 |
| 2020/0274092 A1 | 8/2020 | Yuan et al. | |
| 2020/0388201 A1 | 12/2020 | Wang et al. | |
| 2021/0103176 A1 | 4/2021 | Yoshida et al. | |
| 2022/0327973 A1* | 10/2022 | Yang | ..................... G09G 3/3677 |

FOREIGN PATENT DOCUMENTS

| | | | | |
|---|---|---|---|---|
| CN | 101038384 A | | 9/2007 | |
| CN | 102640042 A | | 8/2012 | |
| CN | 103293736 A | | 9/2013 | |
| CN | 105185345 A | | 12/2015 | |
| CN | 106023945 A | | 10/2016 | |
| CN | 106531044 A | | 3/2017 | |
| CN | 107134264 A | | 9/2017 | |
| CN | 108305581 A | | 7/2018 | |
| CN | 108538237 A | | 9/2018 | |
| CN | 108564912 A | | 9/2018 | |
| CN | 109637447 A | | 4/2019 | |
| CN | 110706639 A | | 1/2020 | |
| CN | 111210755 A | * | 5/2020 | .............. G09G 3/20 |
| CN | 111487825 A | | 8/2020 | |

* cited by examiner

DISPLAY SUBSTRATE AND METHOD FOR MANUFACTURING SAME, AND DISPLAY DEVICE

CROSS-REFERENCE TO RELATED APPLICATION

This application is a U.S. national stage of international application No. PCT/CN2021/079709, filed on Mar. 9, 2021, which claims priority to the Chinese Patent Application No. 202010327231.9, filed on Apr. 23, 2020 and entitled "DISPLAY SUBSTRATE AND METHOD FOR MANUFACTURING SAME, AND DISPLAY DEVICE," the disclosures of which are herein incorporated by reference in their entireties.

TECHNICAL FIELD

The present disclosure relates to the field of display technologies, and in particular, relates to a display substrate and a method for manufacturing the same, and a display device.

BACKGROUND

Liquid crystal display panels are widely used in the display field due to their advantages such as energy saving, low radiation, and high definition.

In the related art, the array substrate in the liquid crystal display panel generally includes a base substrate, wherein the base substrate includes a display region and a non-display region, a gate drive circuit disposed in the non-display region, and a plurality of signal lines disposed in the non-display region and connected to the gate drive circuit. The plurality of signal lines are generally disposed in an encapsulation region in the non-display region and configured to coat the sealant, and thus the plurality of signal lines are generally covered by the sealant. Correspondingly, vias configured to electrically connect the plurality of signal lines to the gate drive circuit are also covered by the sealant.

SUMMARY

The present disclosure provides a display substrate and a method for manufacturing the same, and a display device. The technical solutions are as follows.

In some embodiments, a display substrate is provided. The display substrate includes:

a base substrate including a display region and a non-display region surrounding the display region, wherein the non-display region includes a peripheral region and an encapsulation region sequentially arranged along a direction away from the display region, a sealant being coated in the encapsulation region;

a gate drive circuit disposed in the non-display region;

a plurality of first signal lines disposed in the peripheral region and connected to the gate drive circuit; and a plurality of second signal lines disposed in the non-display region and connected to the gate drive circuit;

wherein each of the first signal line and the second signal line is configured to supply a signal to the gate drive circuit, and a frequency of the signal supplied by the first signal line is lower than a frequency of the signal supplied by the second signal line.

In some embodiments, the first signal lines include a DC power line configured to supply a DC power signal.

In some embodiments, the first signal lines include a start signal line configured to supply a start drive signal.

In some embodiments, the second signal line includes a clock signal line configured to supply a clock signal.

In some embodiments, the gate drive circuit includes an input sub-circuit, an output sub-circuit, a pull-down sub-circuit, and a reset sub-circuit; wherein the input sub-circuit is connected to an input signal terminal, a first power line, and a pull-up node, and is configured to output a first power signal supplied by the first power line to the pull-up node in response to an input signal supplied by the input signal terminal;

the output sub-circuit is connected to the pull-up node, a clock signal line, and an output terminal, and is configured to output a clock signal supplied by the clock signal line to the output terminal in response to a potential of the pull-up node;

the pull-down sub-circuit is connected to a second power line, a third power line, a fourth power line, the pull-up node, and the output terminal, and is configured to output a fourth power signal supplied by the fourth power line to the pull-up node and the output terminal in response to the potential of the pull-up node, a second power signal supplied by the second power line, and a third power signal supplied by the third power line; and the reset sub-circuit is connected to a reset signal terminal, a start signal line, a fifth power line, the fourth power line, and the pull-up node, and is configured to output a fifth power signal supplied by the fifth power line to the pull-up node in response to a reset signal supplied by the reset signal terminal, and to output the fourth power signal to the pull-up node in response to a start drive signal supplied by the start signal line.

In some embodiments, the first signal lines include one or more of the first power line, the second power line, the third power line, the fourth power line, and the fifth power line.

In some embodiments, the display substrate further includes a transistor device layer disposed on the base substrate; wherein the transistor device layer is configured to form a plurality of thin-film transistors in the gate drive circuit, and is provided with a via, wherein the via is configured to connect a gate layer to a source and drain layer in the transistor device layer.

In some embodiments, the display substrate includes a plurality of gate drive circuits cascaded in sequence; wherein a number of the vias disposed in a region where each of the gate drive circuits is disposed is smaller than a number of the thin-film transistors in the gate drive circuit.

In some embodiments, each of the gate drive circuits includes eleven thin-film transistors; and ten vias are disposed in the region where each of the gate drive circuits is disposed.

In some embodiments, in the ten vias, one via is disposed in the encapsulation region, and the remaining vias are disposed in the peripheral region.

In some embodiments, the plurality of second signal lines are disposed in the peripheral region.

In some embodiments, the plurality of second signal lines are disposed in the encapsulation region.

In some embodiments, a method for manufacturing a display substrate is provided. The method is applicable to manufacturing the display substrate as described in the above aspect. The method includes:

providing a base substrate including a display region and a non-display region surrounding the display region, wherein the non-display region includes a peripheral region and an encapsulation region sequentially arranged along a direction away from the display region, a sealant being coated in the encapsulation region;

forming a gate drive circuit in the non-display region;

forming a plurality of first signal lines connected to the gate drive circuit in the peripheral region; and forming a plurality of second signal lines connected to the gate drive circuit in the non-display region;

wherein each of the first signal line and the second signal line is configured to supply a signal to the gate drive circuit, and a frequency of the signal supplied by the first signal line is lower than a frequency of the signal supplied by the second signal line.

In some embodiments, a display device is provided. The display device includes a signal supply circuit and a display substrate as described in the above aspect; wherein the signal supply circuit is connected to a signal line in the display substrate, and is configured to supply a drive signal to the signal line.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the invention concept of the present disclosure, the inventive concept protected by the embodiments of the present disclosure are described in detail hereinafter with reference to the accompanying drawings and some embodiments.

In order to ensure the pass rate and yield of a display device, various components of the display device are generally tested under an environment with specific temperature and humidity before the display device leaves the factory. For example, a product reliability test performed on the display substrate in the display device in an environment of 85% humidity and 85 degrees Celsius (° C.) may also be referred to as 8585 reliability verification.

However, due to poor sealing of the sealant, moisture may enter the encapsulation region, resulting in that the vias may be corroded and the yield of the liquid crystal display panel is poor.

In the 8585 reliability verification, it can be found that the display substrate is prone to horizontal stripes defect due to corrosion of vias, which is generally manifested as whitening of a conductive film layer made of indium tin oxide (ITO) material, that is, an ITO conductive film layer. In addition, the corrosion of the vias is generally caused by entry of moisture due to poor sealing. The principle of the corrosion of the vias is described hereinafter. The different chemical reactions of the ITO conductive film layer connected to an anode and a cathode of a light-emitting element in the display substrate are as follows:

Cathodic reaction: $In_2O_3 + 3H_2O + 6e \rightarrow 2In + 6OH^-$; and

Anode reaction: $4OH^- \rightarrow O_2 + 2H_2O + 4e$.

Based on the above chemical reactions, it can be seen that in the case that the ITO conductive film layer is connected to the cathode, the ITO conductive film layer is prone to electrochemical corrosion reaction to generate elemental indium (In) where moisture enters, and In is generally white. After In is generated, a sheet resistance of the ITO conductive film layer is become larger, resulting in a larger resistance at the position where the via is configured to connect the signal line. Where the ITO conductive film layer is operated in a high temperature and high humidity environment for a long time, the heat at the via becomes larger and larger, which may eventually cause the via to be corroded and burned. Furthermore, the efficiency and degree of the corrosion of the vias are positively correlated with the absolute value of the voltage of the cathode. That is, where the absolute value of the cathode voltage is larger, the corrosion of the via is faster and more serious.

Figure 1:
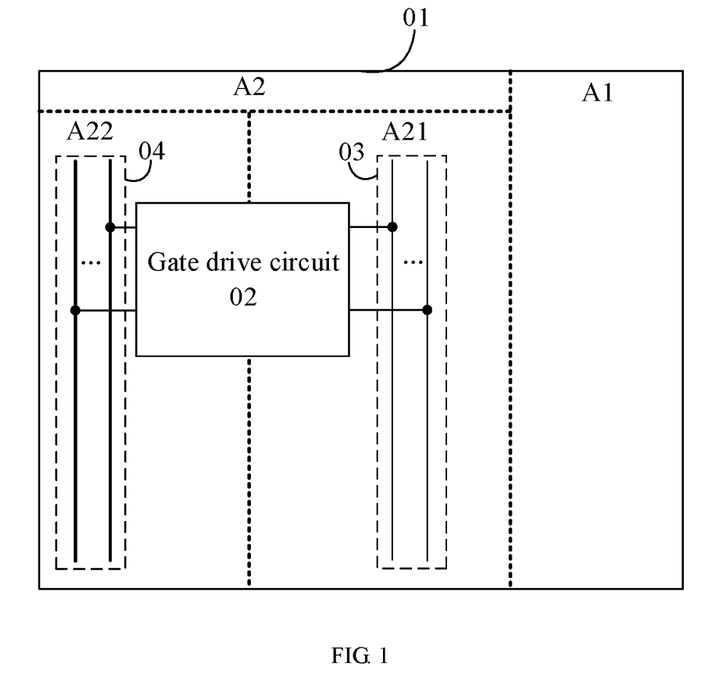
FIG. 1 is a schematic structural diagram of a display substrate according to one or more embodiments of the present disclosure.

An embodiment of the present disclosure provides a display substrate, which can solve the problem that vias are easily corroded. FIG. 1 shows a display substrate according to an embodiment of the present disclosure. As shown in FIG. 1, the display substrate may include a base substrate 01, a gate drive circuit 02, a plurality of first signal lines 02, and a plurality of second lines 04.

The base substrate 01 may include a display region A1 and a non-display region A2 surrounding the display region A1. The display region A1 is provided with a plurality of pixels arranged in an array. The non-display region A2 may include a peripheral region A21 and an encapsulation region A22 sequentially arranged along a direction away from the display region A1. A sealant is coated in the encapsulation region A22 (not shown in FIG. 1).

The gate drive circuit 02 may be disposed in the non-display region A2 and may be configured to supply gate drive signals to one or more rows of pixels in the display region A1.

For example, with reference to FIG. 1, the shown gate drive circuit 02 is partly disposed in the peripheral region A21 in the non-display region A2, and is partly disposed in the encapsulation region A22 in the non-display region A2.

The plurality of first signal lines 03 may be disposed in the peripheral region A21, and may be connected to the gate drive circuit 02.

The plurality of second signal lines 04 may be disposed in the non-display region A2, and may be connected to the gate drive circuit 02.

For example, with reference to FIG. 1, the plurality of second signal lines 04 as shown are all disposed in the encapsulation region A22 in the non-display region A2.

Each of the first signal line 03 and the second signal line 04 may be configured to supply a signal to the gate drive circuit 02, and a frequency of the signal supplied by the first signal line 03 may be lower than a frequency of the signal supplied by the second signal line 04. That is, the first signal line 03 may be a low-frequency signal line, and the second signal line 04 may be a high-frequency signal line. The Low-frequency signal line refers to a signal line with a low frequency range, a slow signal change, and a relatively smooth waveform. The high-frequency signal line refers to a signal line with a high frequency range, a rapid signal change, and a waveform that is prone to sudden changes.

Based on the above analysis of the principle of the corrosion of the via, as an ITO conductive film layer is prone to react with moisture in response to being connected to the low-frequency signal line, the low-frequency signal line is disposed in the region in which the sealant is not coated, in order to avoid the phenomenon that poor sealing of the sealant leads to the corrosion of the via in the case that moisture enters in the embodiment of the present disclosure.

In summary, the embodiment of the present disclosure provides a display substrate. The display substrate includes a base substrate, wherein the base substrate includes a display region and a non-display region, a gate drive circuit, and first signal lines and second signal lines connected to the gate drive circuit. The non-display region includes an encapsulation region coated with a sealant and a peripheral region. As the first signal lines configured to supply signals with lower frequencies are disposed in the peripheral region rather than in the encapsulation region, the first signal lines are not covered by the sealant. In this way, the problem that moisture enters the encapsulation region due to poor sealing and the vias are corroded due to the influence of the low-frequency signal lines may be avoided. The display substrate according to the embodiment of the present disclosure has a higher yield and a better display effect.

Optionally, in order to drive the gate drive circuit 02 to operate normally, the gate drive circuit 02 generally needs to be connected to a DC power line configured to supply a DC power signal, a clock signal line configured to supply a clock signal, and/or a start signal line configured to supply a start drive signal.

As the waveform of the clock signal supplied by the clock signal line changes frequently, the waveform of the DC power line does not change, and the start signal line generally changes only once, it can be seen that the clock signal line is the high-frequency signal line with respect to the DC power line and the start signal line. That is, the DC power line and the start signal line may be classified as the low-frequency signal lines. Therefore, in the embodiments of the present disclosure, the first signal lines 03 may include the DC power line, and/or the start signal line. The second signal lines 04 may include the clock signal line.

Figure 2:
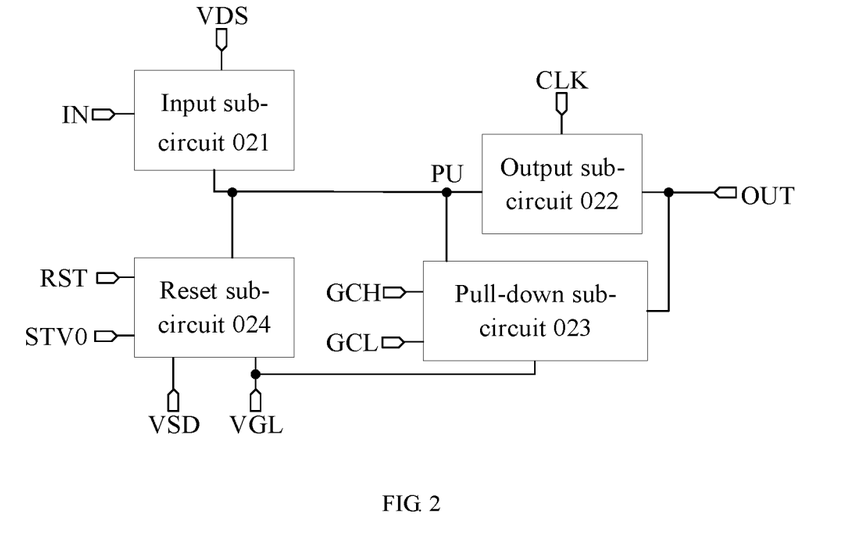
FIG. 2 is a schematic structural diagram of a gate drive circuit according to one or more embodiments of the present disclosure.

Optionally, FIG. 2 is a schematic structural diagram of a gate drive circuit according to an embodiment of the present disclosure. As shown in FIG. 2, the gate drive circuit 02 may include an input sub-circuit 021, an output sub-circuit 022, a pull-down sub-circuit 023, and a reset sub-circuit 024.

The input sub-circuit 021 may be connected to an input signal terminal IN, a first power line VDS, and a pull-up node PU. The input sub-circuit 021 may be configured to output a first power signal supplied by the first power line VDS to the pull-up node PU in response to an input signal supplied by the input signal terminal IN.

Optionally, the first power signal may be a DC power signal, and a potential of the first power signal may be a valid potential. Optionally, the first power signal may be a non-DC power signal, and only in the case that the potential of the input signal is the valid potential, the potential of the first power signal is the valid potential.

In an exemplary embodiment, the input sub-circuit 021 may output the first power signal of a valid potential to the pull-up node PU in the case that the potential of the input signal supplied by the input signal terminal IN is the valid potential, thereby charging the pull-up node PU.

The output sub-circuit 022 may be connected to the pull-up node PU, a clock signal line CLK, and an output terminal OUT. The output sub-circuit 022 may be configured to output a clock signal supplied by the clock signal line CLK to the output terminal OUT in response to the potential of the pull-up node PU.

In an exemplary embodiment, the output sub-circuit 022 may output the clock signal supplied by the clock signal line CLK to the output terminal in the case that the potential of the pull-up node PU is the valid potential.

The pull-down sub-circuit 023 may be connected to a second power line GCH, a third power line GCL, a fourth power line VGL, the pull-up node PU, and the output terminal OUT. The pull-down sub-circuit 023 may be configured to output a fourth power signal supplied by the fourth power line VGL to the pull-up node PU and the output terminal OUT in response to the potential of the pull-up node PU, a second power signal supplied by the second power line GCH, and a third power signal supplied by the third power line GCL.

Optionally, both the second power signal and the third power signal may be DC power signals. Optionally, the second power signal and the third power signal may be non-DC power signals, and in the case that the pull-up node PU and the output terminal OUT are required to be denoised, the potential remains at the valid potential. The fourth power signal may be a DC power signal, and the potential of the fourth power signal may be an invalid potential.

In an exemplary embodiment, the pull-down sub-circuit 023 may output the fourth power signal of the invalid potential to the pull-up node PU and the output terminal OUT under the control of the second power signal or the third power signal in the case that the potential of the pull-up node PU is the invalid potential, thereby denoising the pull-up node PU and the output terminal OUT.

The reset sub-circuit 024 may be connected to a reset signal terminal RST, a start signal line STV0, a fifth power line VSD, the fourth power line VGL, and the pull-up node PU. The reset sub-circuit 024 may be configured to output a fifth power signal supplied by the fifth power line VSD to the pull-up node PU in response to the reset signal supplied by the reset signal terminal RST, and output the fourth power signal to the pull-up node PU in response to a start drive signal supplied by the start signal line STV0.

Optionally, the fifth power signal may be a DC power signal, and the potential of the fifth power signal may be the invalid potential. Optionally, the fifth power signal may be the non-DC power signal, and only in the case that the potential of the reset signal is the valid potential, the potential of the fifth power signal is the valid potential.

In an exemplary embodiment, the reset sub-circuit 024 may output the fourth power signal of the invalid potential to the pull-up node PU in the case that the potential of the reset signal supplied by the reset signal terminal RST is the valid potential, thereby denoising the pull-up node PU. And the reset sub-circuit 024 may output the fourth power signal of the invalid potential to the pull-up node PU in the case that the potential of the start drive signal supplied by the start signal line STV0 is the valid potential, thereby denoising the pull-up node PU.

It should be noted that the start signal line STV0 may supply the start drive signal of the valid potential prior to scanning each frame to achieve a total reset of the pull-up node PU, which may improve the phenomenon of horizontal stripes defect to a certain extent.

Optionally, for the gate drive circuit shown in FIG. 2, the gate drive circuit 02 may be of an 11T1C structure. That is, the gate drive circuit 02 may include 11 thin-film transistors and 1 capacitor. The gate drive circuit 02 may further be of other structures, such as 16T1C. Taking the 11T1C structure as an example, FIG. 3 is a schematic structural diagram of a gate drive circuit.

Figure 3:
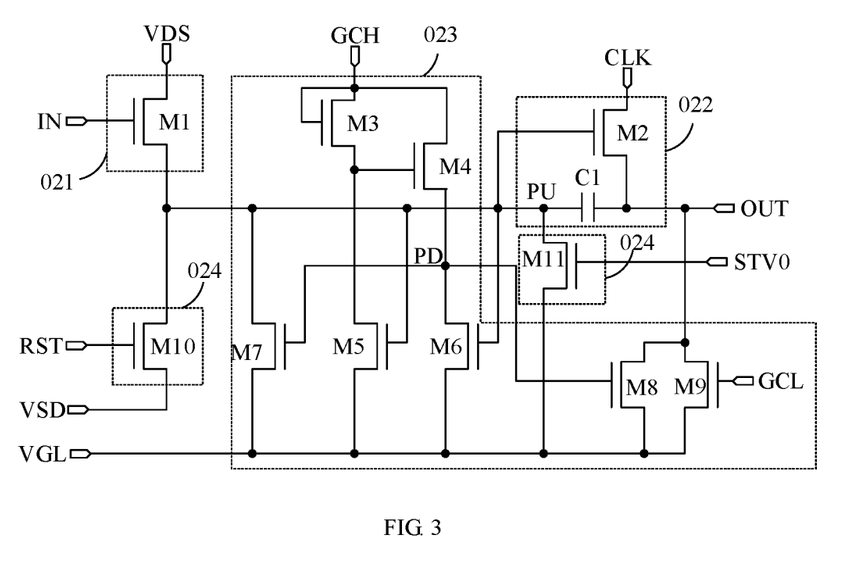
FIG. 3 is a schematic structural diagram of another gate drive circuit according to one or more embodiments of the present disclosure.

With reference to FIG. 3, the input sub-circuit 021 may include a first transistor M1. A gate electrode of the first transistor M1 may be connected to the input signal terminal IN, a first electrode of the first transistor M1 may be connected to the first power line VDS, and a second electrode of the first transistor M1 may be connected to the pull-up node PU.

With continued reference to FIG. 3, the output sub-circuit 022 may include a second transistor M2 and a capacitor C1. A gate electrode of the second transistor M2 may be connected to the pull-up node PU, a first electrode of the second transistor M2 may be connected to the clock signal line CLK, and a second electrode of the second transistor M2 may be connected to the output terminal OUT. One end of the capacitor C1 may be connected to the pull-up node PU, and the other end of the capacitor C1 may be connected to the output terminal OUT.

With continued reference to FIG. 3, the pull-down sub-circuit 023 may include a third transistor M3, a fourth transistor M4, a fifth transistor M5, a sixth transistor M6, a seventh transistor M7, an eighth transistor M8, and a ninth transistor M9. Both a gate electrode and a first electrode of the third transistor M3 may be connected to the second power line GCH, and a second electrode of the third transistor M3 may be connected to a gate electrode of the fourth transistor M4 and a second electrode of the fifth transistor M5. A first electrode of the fourth transistor M4 may be connected to the second power line GCH, and a second electrode of the fourth transistor M4 may be connected to the pull-down node PD. Both a gate electrode of the fifth transistor M5 and a gate electrode of the sixth transistor M6 may be connected to the pull-up node PU, and both a first electrode of the fifth transistor M5 and a first electrode of the sixth transistor M6 may be connected to the fourth power line VGL. A second electrode of the sixth transistor M6 may be connected to the pull-down node PD. Both a gate electrode of the seventh transistor M7 and a gate electrode of the eighth transistor M8 may be connected to the pull-down node PD, both a first electrode of the seventh transistor M7 and a first electrode of the eighth transistor M8 may be connected to the fourth power line VGL, a second electrode of the seven transistor M7 may be connected to the pull-up node PU, and a second electrode of the eighth transistor M8 may be connected to the output terminal OUT. A gate electrode of the ninth transistor M9 may be connected to the third power line GCL, a first electrode of the ninth transistor M9 may be connected to the fourth power line VGL, and a second electrode of the ninth transistor M9 may be connected to the output terminal OUT.

Still with reference to FIG. 3, the reset sub-circuit 024 may include a tenth transistor M10 and an eleventh transistor M11. A gate electrode of the tenth transistor M10 may be connected to the reset signal terminal RST, a first electrode of the tenth transistor M10 may be connected to the fifth power line VSD, and a second electrode of the tenth transistor M10 may be connected to the pull-up node PU. A gate electrode of the eleventh transistor M11 may be connected to the start signal line STV0, a first electrode of the eleventh transistor M11 may be connected to the fourth power line VGL, and a second electrode of the eleventh transistor M11 may be connected to the pull-up node PU.

It should be further noted that the display substrate according to the embodiments of the present disclosure may include a plurality of gate drive circuits 02 cascaded in sequence. An output terminal OUT of each stage of shift register units may be connected to an input signal terminal IN of a previous stage of shift register unit and a reset signal terminal RST of a next stage of shift register unit. Furthermore, the plurality of cascaded gate drive circuits 02 may adopt a 4-phase clock. That is, the plurality of cascaded gate drive circuits 02 may be divided into a plurality of groups, each group may include four gate drive circuits 02, and the four gate drive circuits 02 may be sequentially connected to four clock signal lines. Other number of clocks such as a 6-phase clock or an 8-phase clock may also be adopted. Optionally, three start signal lines may be adopted. Similar to the 4-phase clock, the plurality of cascaded gate drive circuits 02 may be divided into a plurality of groups, each group may include three gate drive circuits 02, and the three gate drive circuits 02 may be sequentially connected to the three start signal lines. More start signal lines may further be adopted, which is not limited in the embodiments of the present disclosure.

For the gate drive circuit shown in FIGS. 2 and 3, the first signal lines 03 disposed in the peripheral region A21 may include one or more of the first power line VDS, the second power line GCH, the third power line GCL, the fourth power line VGL, and the fifth power line VSD.

Figure 4:
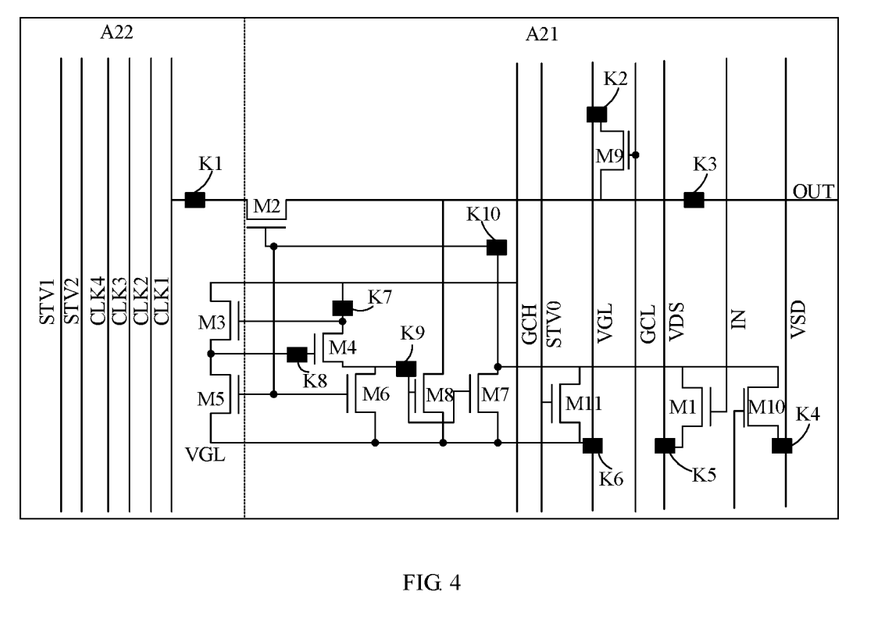
FIG. 4 is a schematic structural diagram of another display substrate according to one or more embodiments of the present disclosure.

In an exemplary embodiment, the gate drive circuit shown in FIG. 3 adopting the 4-phase clock and including 3 start signal lines is taken as an example. FIG. 4 shows a schematic structural diagram of another display substrate according to an embodiment of the present disclosure. It can be seen with reference to FIG. 4 that in the shown display substrate, the first signal lines 03 disposed in the peripheral region A21 include the first power line VDS, the second power line GCH, the third power line GCL, the fourth power line VGL, the fifth power line VSD, and the start signal line STV0. The second signal lines 04 disposed in the encapsulation region A22 include a clock signal line CLK1, a clock signal line CLK2, a clock signal line CLK3, a clock signal line CLK4, and two start signal lines STV1 and STV2.

By disposing more low-frequency signal lines in the peripheral region A21, more vias may be correspondingly disposed in the peripheral region A21 without being covered by the sealant, which further prevents the vias from being corroded.

Optionally, the display substrate may further include a transistor device layer disposed on the base substrate 01. The transistor device layer may be configured to form a plurality of thin-film transistors in the gate drive circuit 02, for example, may be configured to form the 11 thin-film transistors M1 shown in FIGS. 3 and 4.

Figure 5:
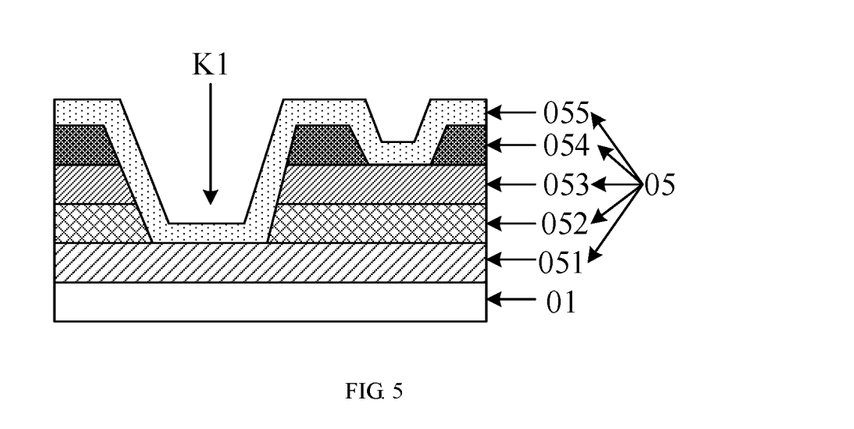
FIG. 5 is a schematic structural diagram of a transistor device layer according to one or more embodiments of the present disclosure.

FIG. 5 is a schematic structural diagram of a transistor device layer according to an embodiment of the present disclosure. As shown in FIG. 5, the transistor device layer 05 may include a gate layer 051, a gate insulation (GI) layer 052, a source and drain (SD) layer 053, a passivation (PVX) layer 054, and a conductive film layer ITO 055 that are disposed on a side of the base substrate 01 and are stacked along a direction away from the base substrate 01. It should be noted that the transistor device layer may be referred to as a bottom gate structure.

The transistor device layer 05 may be provided with a via K. The via K may be configured to connect the gate layer 051 and the source and drain layer 053 in the transistor device layer 05, such that the signal between the gate layer 051 and the source and drain layer 053 is conducted. That is, each via K may be disposed in the same layer as the gate layer 051 and the source and drain layer 053, and each via K needs to penetrate to the gate layer 051 to expose the gate layer 051, such that the conductive film layer 055 can electrically connect to the gate layer 051 and the source and drain layer 053 in response to being disposed in the via K.

Optionally, in the embodiments of the present disclosure, due to the location of the first signal line 03, the number of vias disposed in a region where each gate drive circuit 02 is disposed may be smaller than the number of thin-film transistors M1 in the gate drive circuit 02. As the number of vias is reduced, more vias are prevented from being corroded and causing more serious horizontal stripes defect.

For example, with reference to FIG. 4, each gate drive circuit 02 includes 11 thin-film transistors M1. Ten vias K1 to K10 are disposed in the region where each gate drive circuit 02 is disposed. For the structure of each of the ten vias K1 to K10, reference may be made to the structure of the via K shown in FIG. 5.

Figure 6:
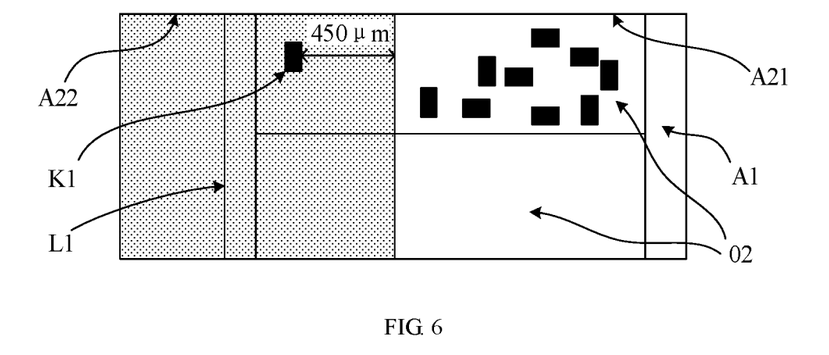
FIG. 6 is a schematic structural diagram of still another display substrate according to one or more embodiments of the present disclosure.

Optionally, taking the display substrate shown in FIG. 4 as an example, FIG. 6 shows a schematic structural diagram of a display substrate that only includes the base substrate 01 and the vias. As shown in FIG. 6, in the ten vias, only one via K1 may be disposed in the encapsulation region A22, and the remaining vias (e.g., the vias K2 to K10 shown in FIG. 4) may all be disposed in the peripheral region A21.

For example, in conjunction with the gate drive circuit shown in FIG. 4, it can be seen that the via K1 disposed in the encapsulation region A22 may be a via configured to connect the clock signal line CLK1 to the first electrode of the thin-film transistor M2, such that in the case that the thin-film transistor M2 is conducted under the control of the potential of the gate, the clock signal line CLK1 may output a clock signal to the second electrode of the thin-film transistor M2. For the remaining vias K2 to K10 in the peripheral region A21:

The via K2 may be configured to connect the fourth power line VGL to the first electrode of the thin-film transistor M9, such that in the case that the thin-film transistor M9 is conducted under the control of the potential of the gate electrode, the fourth power line VGL may output the fourth power signal to the second electrode of the thin-film transistor M9.

The via K3 may be configured to connect the second electrode of the thin-film transistor M2 and the second electrode of the thin-film transistor M9 to the output terminal OUT, such that the thin-film transistor M2 outputs the clock signal to the output terminal OUT, or the thin-film transistor M9 outputs the fourth power signal to the output terminal OUT.

The via K4 may be configured to connect the fifth power line VSD to the first electrode of the thin-film transistor M10, such that in the case that the thin-film transistor M10 is conducted under the control of the potential of the gate electrode, the fifth power line VSD may output the fifth power signal to the second electrode of the thin-film transistor M10.

The via K5 may be configured to connect the first power line VDS to the first electrode of the thin-film transistor M1, such that in the case that the thin-film transistor M1 is conducted under the control of the potential of the gate electrode, the first power line VDS may output the first power signal to the second electrode of the thin-film transistor M1.

The via K6 may be configured to connect the fourth power line VGL to the first electrode of the thin-film transistor M11, such that in the case that the thin-film transistor M11 is conducted under the control of the potential of the gate electrode, the fourth power line VGL may output the fourth power signal to the second electrode of the thin-film transistor M11.

The via K7 may be configured to connect the second power line GCH to the first electrode of the thin-film transistor M4, such that in the case that the thin-film transistor M4 is conducted under the control of the potential of the gate electrode, the second power line GCH may output the first power signal to the second electrode of the thin-film transistor M4.

The via K8 may be configured to electrically connect the second electrode of thin-film transistor M3 to the gate electrode of thin-film transistor M4, such that the potential of the second electrode of thin-film transistor M3 may be output to the gate electrode of thin-film transistor M4 to control the on-off state of the thin-film transistor M4.

The via K9 may be configured to electrically connect the second electrode of the thin-film transistor M4 to the gate electrode of the thin-film transistor M8, such that the potential of the second electrode of the thin-film transistor M4 may be output to the gate electrode of the thin-film transistor M8 to control the on-off state of the thin-film transistor M8.

The via K10 may be acted as a via connecting the pull-up node PU and the thin-film transistors (e.g., M2, M6, M7, M11, M1, and M10), in order to control the thin-film transistors, or control the on-off state of the thin-film transistors.

It should be noted that the first electrode may be the source electrode of the thin-film transistor, and correspondingly, the second electrode may be the drain electrode of the thin-film transistor. Optionally, the first electrode may be the drain electrode of the thin-film transistor, and the second electrode may be the source electrode of the thin-film transistor.

In addition, in conjunction with the display substrate of the size shown in FIG. 4 and FIG. 6, a distance between the via K1 disposed in the encapsulation region A22 and the encapsulation region A22 proximal to the peripheral region A21 may be 450 μm. For display substrates of different areas, the distance between the via K1 disposed in the encapsulation region A22 and the encapsulation region A22 proximal to the peripheral region A21 may be different. The pattern filled in A22 shown in FIG. 6 may be a sealant. L1 is a cutting line, that is, the location of L1 is an edge of the display substrate. By disposing a smaller number of vias in the encapsulation region, it is possible to prevent more vias from being corroded and causing more serious horizontal stripes defect.

For the gate drive circuit of the structure shown in FIG. 3, in the related art, as the start signal line STV0, the second power line GCH, and the fourth power line VGL are all disposed in the encapsulation region A22, the number of vias needs to be greater than the number of thin-film transistors contained in the gate drive circuit to ensure that the thin-film transistors are reliably connected to the signal lines. For example, the number of vias is generally about 12. Moreover, a larger number of vias are generally disposed in the encapsulation region A22. For example, the number of vias in the encapsulation region A22 is generally about five. In addition, in the encapsulation region A22, a distance between the via, most proximal to the peripheral region A21 from the encapsulation region A22 between the side of the encapsulation region A22 proximal to the peripheral region A21 is smaller, generally about 240 µm. In addition, the width of the region occupied by the gate drive circuit 02 is also relatively large, generally about 660 µm.

In the embodiment of the present disclosure, by disposing the first signal lines 03 on the side, proximal to the display region A1, of the gate drive circuit 02, that is, the inner side of the gate drive circuit 02, the original number of vias can be reduced from 12to 10, the number of vias in the encapsulation region A22 may be reduced from 5 to 1, and the distance between a via in the encapsulation region A22 and the side, proximal to the peripheral region A21, of the encapsulation region A22 p may be increased to 450 µm. In addition, the arrangement of the embodiments of the present disclosure may further reduce the width of the region occupied by the gate drive circuit 02 from 660 µm in the related art to 640 µm. With such an arrangement, under the premise of achieving a narrow frame, the corrosion of the via phenomenon caused by poor sealing of the sealant may be validly and reliably avoided. In addition, in order to further ensure that the vias are not corroded, a sealant with greater waterproof performance may further be used to deal.

Optionally, in conjunction with FIG. 1 and FIG. 4, the plurality of second signal lines 04 described in the embodiments of the present disclosure may all be disposed in the encapsulation region A22. In order to further ensure the yield, the plurality of second signal lines 04 may further be disposed in the peripheral region A21. That is, all the signal lines connected to the gate drive circuit 02 are not covered by the sealant.

Figure 7:
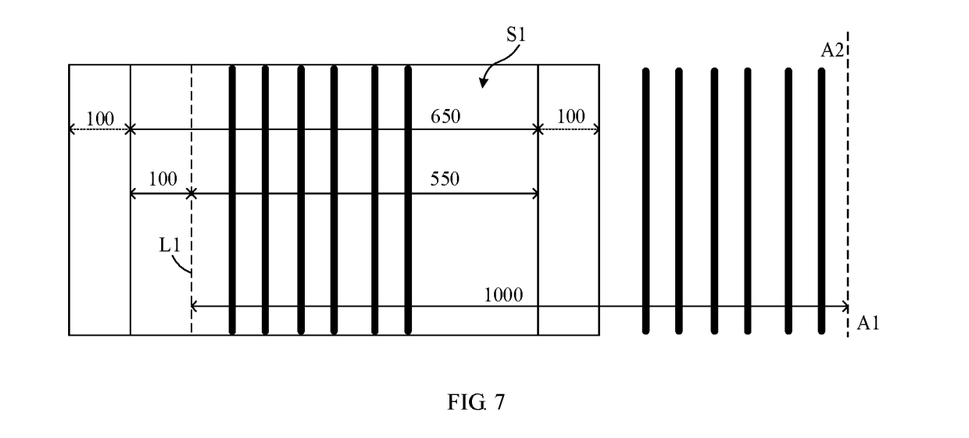
FIG. 7 is a schematic structural diagram of yet still another display substrate according to one or more embodiments of the present disclosure.

FIG. 7 shows a schematic structural diagram of another display substrate, where the non-display region A2 including twelve signal lines, six of which are disposed in the peripheral region and six disposed in the encapsulation region, is taken as an example. It can be seen from FIG. 7 that the coating width of the sealant S1 on the encapsulation region may be 650 µm, and after being coated, the sealant S1 overflows 100 µm at the left and right sides. The cutting line L1 is generally disposed at a location of the sealant S1 100 µm near the peripheral region. That is, the distance between the cutting line L1 and the side, proximal to the display region, of the encapsulation region is 550 µm. In addition, the distance between the cutting line L1 and the side, proximal to the display region A1, of the non-display region A2 may be 1000 µm.

It should be noted that FIG. 7 is only a schematic illustration, and the coating width of the sealant may be different based on display substrates of different areas. In addition, the area of the non-display region A2 is generally much smaller than the area of the display region A1, and the ratio of the display region A1 and the non-display region A2 shown in the accompanying drawings of the embodiments of the present disclosure is merely a schematic illustration.

In summary, the embodiment of the present disclosure provides a display substrate. The display substrate includes a base substrate, wherein the base substrate includes a display region and a non-display region, a gate drive circuit, and first signal lines and second signal lines connected to the gate drive circuit. The non-display region includes an encapsulation region coated with a sealant and a peripheral region. As the first signal lines configured to supply signals with lower frequencies are disposed in the peripheral region rather than in the encapsulation region, the first signal lines are not covered by the sealant. In this way, the problem that moisture enters the encapsulation region due to poor sealing and the vias are corroded due to the influence of the low-frequency signal lines may be avoided. The display substrate according to the embodiment of the present disclosure has a higher yield and a better display effect.

Figure 8:
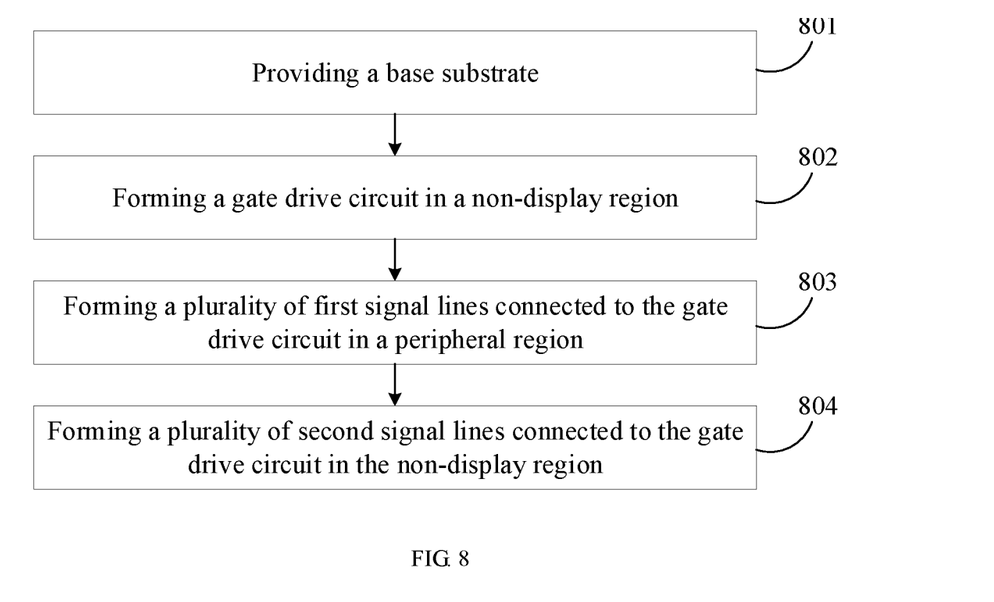
FIG. 8 is a flowchart of a method for manufacturing a display substrate according to one or more embodiments of the present disclosure.

FIG. 8 is a method for manufacturing a display substrate according to an embodiment of the present disclosure, and the method is configured to manufacture the display substrate as shown in FIG. 1 or FIG. 4. As shown in FIG. 8, the method may include the following processes.

In S801, a base substrate is provided.

Optionally, with reference to FIG. 1, the base substrate may include a display region A1 and a non-display region A2 surrounding the display region A1. The non-display region A2 may include a peripheral region A21 and an encapsulation region A22 sequentially arranged along a direction away from the display region A1. Furthermore, the encapsulation region A22 may be coated with a sealant.

In S802, a gate drive circuit is formed in the non-display region.

Optionally, with reference to FIGS. 1 and 4, the gate drive circuit 02 may be formed in part of the peripheral region A21 and part of the encapsulation region A22.

In S803, a plurality of first signal lines connected to the gate drive circuit are formed in the peripheral region.

Optionally, with reference to FIG. 1, the plurality of first signal lines 03 connected to the gate drive circuit 02 may be merely formed in the peripheral region A21 not coated with the sealant.

In S804, a plurality of second signal lines connected to the gate drive circuit are formed in the non-display region.

Optionally, with reference to FIG. 1, the plurality of second signal lines 04 connected to the gate drive circuit 02 may be merely formed in the encapsulation region A22 coated with the sealant. Optionally, the plurality of second signal lines 04 connected to the gate drive circuit 02 may be merely formed in the peripheral region A21. Optionally, the plurality of second signal lines 04 connected to the gate drive circuit 02 may be formed in part of the peripheral region A21 and part of the encapsulation region A22.

Each of the first signal line 03 and the second signal line 04 may be configured to supply a signal to the gate drive circuit 02, and a frequency of the signal supplied by the first signal line 03 may be lower than a frequency of the signal supplied by the second signal line 04. That is, the first signal line 03 may be a low-frequency signal line, and the second signal line 04 may be a high-frequency signal line.

In summary, the embodiment of the present disclosure provides a method for manufacturing a display substrate. The method includes forming a base substrate, wherein the base substrate includes a display region and a non-display region, a gate drive circuit, and first signal lines and second signal lines connected to the gate drive circuit. The non-display region includes an encapsulation region coated with a sealant and a peripheral region. As the first signal lines configured to supply signals with lower frequencies are disposed in the peripheral region rather than in the encapsulation region, the first signal lines are not covered by the sealant. In this way, the problem that moisture enters the encapsulation region due to poor sealing and the vias are corroded due to the influence of the low-frequency signal lines may be avoided. The display substrate according to the embodiment of the present disclosure has a higher yield and a better display effect.

Figure 9:
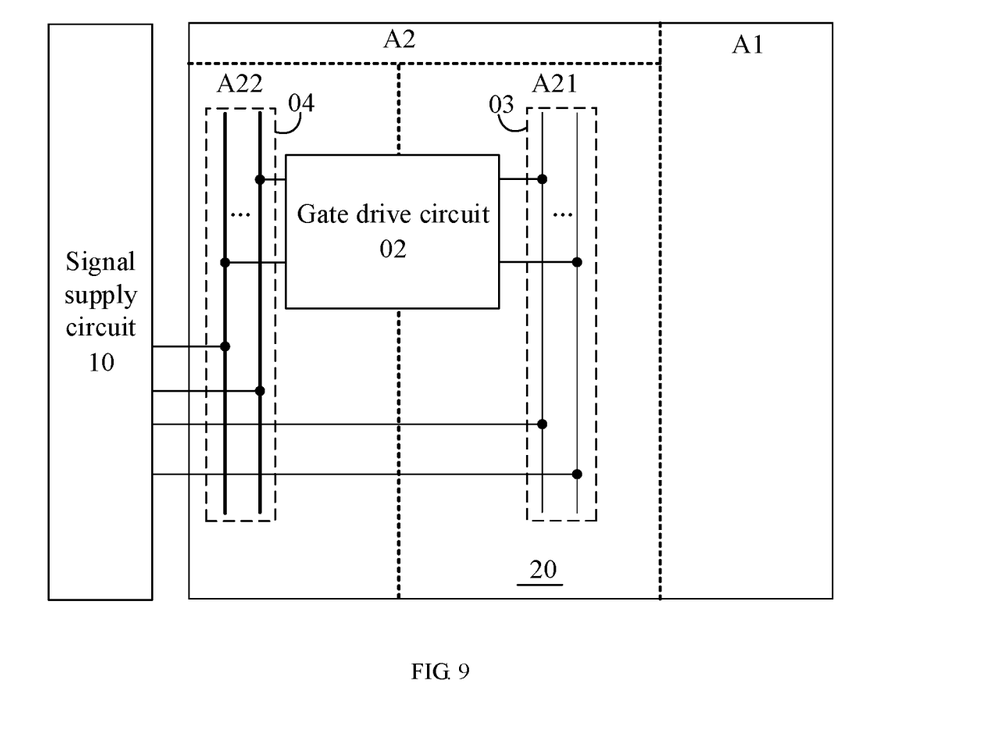
FIG. 9 is a schematic structural diagram of a display device according to one or more embodiments of the present disclosure.

FIG. 9 is a schematic structural diagram of a display device according to an embodiment of the present disclosure. As shown in FIG. 9, the display device may include a signal supply circuit 10 and the display substrate 20 shown in FIG. 1 or FIG. 4. The signal supply circuit 10 may be connected to a signal line in the display substrate 20, and may be configured to supply a drive signal to the signal line. For example, the signal supply circuit 10 may be a timing controller.

For example, in conjunction with FIGS. 1 and 9, the display substrate 20 may include a plurality of first signal lines 03 and a plurality of second signal lines 04, and the signal supply circuit 10 may be connected to the first signal lines 03 and the second signal lines 04 and configured to supply the drive signal to the first signal line 03 and the second signal line 04.

Optionally, the display device may be a liquid crystal display, an electronic paper, a mobile phone, a tablet PC, a television set, a monitor, a notebook, and other products or components with a display function.

It should be pointed out that in the accompanying drawings, the sizes of layers and areas may be exaggerated for clarity of illustration. It should also be understood that in the case that an element or layer is referred to as being "on" another element or layer, it may be directly on the other element, or intervening layers may be present. In addition, it should be understood that in the case that an element or layer is referred to as being "under" another element or layer, it may be directly under the other element, or there may be more than one intervening layer or element. In addition, it can also be understood that in the case that a layer or element is referred to as being "between" two layers or two elements, it may be the only layer between the two layers or two elements, or more than one intervening layer or element may also be present. Similar reference numerals indicate similar elements throughout.

In the present disclosure, the terms "first" and "second" are merely used for descriptive purposes, and cannot be understood as indicating or implying relative importance. The term "a plurality of" refers to two or more, unless expressly defined otherwise. The term "and/or" merely describes an association relationship of associated objects, indicating that three types of relationships may exist. For example, A and/or B may indicate: A exists alone, both A and B exist, and B exists alone.

Described above are merely optional embodiments of the present disclosure, and are not intended to limit the embodiments of the present disclosure. Any modifications, equivalent substitutions, improvements, and the like within the spirit and principles of the embodiments of the present disclosure shall fall within the protection scope of the embodiments of the present disclosure.

What is claimed is:

1. A display substrate, comprising:
   a base substrate comprising a display region and a non-display region surrounding the display region, wherein the non-display region comprises a peripheral region and an encapsulation region sequentially arranged along a direction away from the display region, a sealant being coated in the encapsulation region;
   a gate drive circuit disposed in the non-display region;
   a plurality of first signal lines disposed in the peripheral region and connected to the gate drive circuit;
   a plurality of second signal lines disposed in the non-display region and connected to the gate drive circuit; and
   a transistor device layer disposed on the base substrate, wherein the transistor device layer is configured to form a plurality of thin-film transistors in the gate drive circuit, and is provided with a via, wherein the via is configured to connect a gate layer to a source and drain layer in the transistor device layer;
   wherein each of the first signal line and the second signal line is configured to supply a signal to the gate drive circuit, and a frequency of the signal supplied by the first signal line is lower than a frequency of the signal supplied by the second signal line; and the display substrate comprises a plurality of gate drive circuits cascaded in sequence; wherein a number of the vias disposed in a region where each of the gate drive circuits is disposed is less than a number of the thin-film transistors in the gate drive circuit.

2. The display substrate according to claim 1, wherein the first signal lines comprise a DC power line configured to supply a DC power signal.

3. The display substrate according to claim 1, wherein the first signal lines comprise a start signal line configured to supply a start drive signal.

4. The display substrate according to claim 1, wherein the second signal lines comprise a clock signal line configured to supply a clock signal.

5. The display substrate according to claim 1, wherein the gate drive circuit comprises an input sub-circuit, an output sub-circuit, a pull-down sub-circuit, and a reset sub-circuit; wherein
   the input sub-circuit is connected to an input signal terminal, a first power line, and a pull-up node, and is configured to output a first power signal supplied by the first power line to the pull-up node in response to an input signal supplied by the input signal terminal;
   the output sub-circuit is connected to the pull-up node, a clock signal line, and an output terminal, and is configured to output a clock signal supplied by the clock signal line to the output terminal in response to a potential of the pull-up node;
   the pull-down sub-circuit is connected to a second power line, a third power line, a fourth power line, the pull-up node, and the output terminal, and is configured to output a fourth power signal supplied by the fourth power line to the pull-up node and the output terminal in response to the potential of the pull-up node, a second power signal supplied by the second power line, and a third power signal supplied by the third power line; and
   the reset sub-circuit is connected to a reset signal terminal, a start signal line, a fifth power line, the fourth power line, and the pull-up node, and is configured to output a fifth power signal supplied by the fifth power line to the pull-up node in response to a reset signal supplied by the reset signal terminal, and to output the fourth power signal to the pull-up node in response to a start drive signal supplied by the start signal line.

6. The display substrate according to claim 5, wherein the first signal lines comprise one or more of the first power line, the second power line, the third power line, the fourth power line, and the fifth power line.

7. The display substrate according to claim 1, wherein each of the gate drive circuits comprises eleven thin-film transistors; and ten vias are disposed in the region where each of the gate drive circuits is disposed.

8. The display substrate according to claim 7, wherein in the ten vias, one via is disposed in the encapsulation region, and the remaining vias are disposed in the peripheral region.

9. The display substrate according to claim 1, wherein the plurality of second signal lines are disposed in the peripheral region.

10. The display substrate according to claim 1, wherein the plurality of second signal lines are disposed in the encapsulation region.

11. The display substrate according to claim 6, wherein
the second signal lines comprise the clock signal line configured to supply the clock signal, and the plurality of second signal lines are disposed in the peripheral region or the encapsulation region;
the display substrate further comprises: a transistor device layer disposed on the base substrate, wherein the transistor device layer is configured to form a plurality of thin-film transistors in the gate drive circuit and is provided with a via, wherein the via is configured to connect a gate layer to a source and drain layer in the transistor device layer; and
the display substrate comprises: a plurality of gate drive circuits cascaded in sequence, wherein each of the gate drive circuits comprises eleven thin-film transistors, and ten vias are disposed in a region where each of the gate drive circuits is disposed, wherein in the ten vias, one via is disposed in the encapsulation region, and the remaining vias are disposed in the peripheral region.

12. A method for manufacturing a display substrate, comprising:
providing a base substrate comprising a display region and a non-display region surrounding the display region, wherein the non-display region comprises a peripheral region and an encapsulation region sequentially arranged along a direction away from the display region, a sealant being coated in the encapsulation region;
forming a gate drive circuit in the non-display region;
forming a plurality of first signal lines connected to the gate drive circuit in the peripheral region;
forming a plurality of second signal lines connected to the gate drive circuit in the non-display region; and
forming a transistor device layer on the base substrate, wherein the transistor device layer is configured to form a plurality of thin-film transistors in the gate drive circuit, and is provided with a via, wherein the via is configured to connect a gate layer to a source and drain layer in the transistor device layer;
wherein each of the first signal line and the second signal line is configured to supply a signal to the gate drive circuit, and a frequency of the signal supplied by the first signal line is lower than a frequency of the signal supplied by the second signal line; and the display substrate comprises a plurality of gate drive circuits cascaded in sequence; wherein a number of the vias disposed in a region where each of the gate drive circuits is disposed is less than a number of the thin-film transistors in the gate drive circuit.

13. A display device, comprising: a signal supply circuit and a display substrate; wherein
the signal supply circuit is connected to a signal line in the display substrate, and is configured to supply a drive signal to the signal line; and
the display substrate comprises:
a base substrate comprising a display region and a non-display region surrounding the display region, wherein the non-display region comprises a peripheral region and an encapsulation region sequentially arranged along a direction away from the display region, a sealant being coated in the encapsulation region;
a gate drive circuit disposed in the non-display region;
a plurality of first signal lines disposed in the peripheral region and connected to the pate drive circuit;
a plurality of second signal lines disposed in the non-display region and connected to the gate drive circuit; and
a transistor device layer disposed on the base substrate, wherein the transistor device layer is configured to form a plurality of thin-film transistors in the gate drive circuit, and is provided with a via, wherein the via is configured to connect a gate layer to a source and drain layer in the transistor device layer;
wherein each of the first signal line and the second signal line is configured to supply a signal to the gate drive circuit, and a frequency of the signal supplied by the first signal line is lower than a frequency of the signal supplied by the second signal line; and the display substrate comprises a plurality of gate drive circuits cascaded in sequence; wherein a number of the vias disposed in a region where each of the gate drive circuits is disposed is less than a number of the thin-film transistors in the gate drive circuit.

14. The display device according to claim 13, wherein the first signal lines comprise a DC power line configured to supply a DC power signal.

15. The display device according to claim 13, wherein the first signal lines comprise a start signal line configured to supply a start drive signal.

16. The display device according to claim 13, wherein the second signal lines comprise a clock signal line configured to supply a clock signal.

17. The display device according to claim 13, wherein the gate drive circuit comprises an input sub-circuit, an output sub-circuit, a pull-down sub-circuit, and a reset sub-circuit; wherein
the input sub-circuit is connected to an input signal terminal, a first power line, and a pull-up node, and is configured to output a first power signal supplied by the first power line to the pull-up node in response to an input signal supplied by the input signal terminal;
the output sub-circuit is connected to the pull-up node, a clock signal line, and an output terminal, and is configured to output a clock signal supplied by the clock signal line to the output terminal in response to a potential of the pull-up node;
the pull-down sub-circuit is connected to a second power line, a third power line, a fourth power line, the pull-up node, and the output terminal, and is configured to output a fourth power signal supplied by the fourth power line to the pull-up node and the output terminal in response to the potential of the pull-up node, a second power signal supplied by the second power line, and a third power signal supplied by the third power line; and the reset sub-circuit is connected to a reset signal terminal, a start signal line, a fifth power line, the fourth power line, and the pull-up node, and is configured to output a fifth power signal supplied by the fifth power line to the pull-up node in response to a reset signal supplied by the reset signal terminal, and to output the fourth power signal to the pull-up node in response to a start drive signal supplied by the start signal line.

18. The display device according to claim 17, wherein the first signal lines comprise one or more of the first power line, the second power line, the third power line, the fourth power line, and the fifth power line.

\* \* \* \* \*

UNITED STATES PATENT AND TRADEMARK OFFICE
CERTIFICATE OF CORRECTION

PATENT NO. : 11,927,844 B2  
APPLICATION NO. : 17/764448  
DATED : March 12, 2024  
INVENTOR(S) : Zepeng Sun Page 1 of 1

It is certified that error appears in the above-identified patent and that said Letters Patent is hereby corrected as shown below:

On the Title Page

Item (73) should read:
(73) Assignees: Beijing BOE Optoelectronics Technology Co., Ltd., Beijing (CN); BOE Technology Group Co., Ltd., Beijing (CN)

Signed and Sealed this
Twenty-ninth Day of July, 2025

Coke Morgan Stewart
*Acting Director of the United States Patent and Trademark Office*